(12) United States Patent
Kim et al.

(10) Patent No.: US 7,157,741 B2
(45) Date of Patent: Jan. 2, 2007

(54) SILICON OPTOELECTRONIC DEVICE AND OPTICAL SIGNAL INPUT AND/OR OUTPUT APPARATUS USING THE SAME

(75) Inventors: Jun-young Kim, Gunpo-si (KR); Byoung-lyong Choi, Seoul (KR); Eun-kyung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 149 days.

(21) Appl. No.: 10/784,967

(22) Filed: Feb. 25, 2004

(65) Prior Publication Data

US 2004/0208415 A1    Oct. 21, 2004

(30) Foreign Application Priority Data

Feb. 25, 2003   (KR) ..................... 10-2003-0011638

(51) Int. Cl.
  *H01L 27/15*  (2006.01)
  *H01L 29/26*  (2006.01)
  *H01L 31/12*  (2006.01)
  *H01L 33/00*  (2006.01)
  *H01L 31/153* (2006.01)

(52) U.S. Cl. ........................... 257/80; 257/21; 257/79; 257/81; 257/82; 257/83; 257/84; 257/85; 257/86; 257/87; 257/101; 257/102; 257/103

(58) Field of Classification Search ............ 257/79–87, 257/101–103, 21
See application file for complete search history.

(56) References Cited

U.S. PATENT DOCUMENTS

| | | | | |
|---|---|---|---|---|
| 3,879,606 A | * | 4/1975 | Bean .................... | 250/227.11 |
| 4,210,923 A | * | 7/1980 | North et al. ............... | 257/432 |
| 4,371,847 A | * | 2/1983 | Biard et al. ................ | 330/307 |
| 5,101,246 A | * | 3/1992 | Onodera .................... | 257/82 |
| 5,223,919 A | * | 6/1993 | Whight et al. ............. | 257/459 |
| 5,283,447 A | * | 2/1994 | Olbright et al. ............ | 257/85 |
| 5,293,393 A | * | 3/1994 | Kosaka .................. | 372/45.01 |
| 5,361,273 A | * | 11/1994 | Kosaka .................. | 372/50.23 |
| 5,391,896 A | * | 2/1995 | Wanlass .................... | 257/80 |
| 5,565,676 A | * | 10/1996 | Tanabe et al. ............. | 250/340 |
| 5,793,060 A | * | 8/1998 | Morikawa ................... | 257/85 |
| 5,838,174 A | * | 11/1998 | Nakagawa et al. .......... | 257/83 |
| 5,920,078 A | * | 7/1999 | Frey .......................... | 257/14 |
| 6,355,945 B1 | * | 3/2002 | Kadota et al. ............... | 257/82 |
| 6,552,373 B1 | * | 4/2003 | Ando et al. ................ | 257/192 |
| 6,693,736 B1 | * | 2/2004 | Yoshimura et al. ......... | 359/333 |
| 6,744,072 B1 | * | 6/2004 | Romano et al. ............. | 257/81 |

(Continued)

FOREIGN PATENT DOCUMENTS

JP   5-288020   11/1993

*Primary Examiner*—Ida M. Soward
(74) *Attorney, Agent, or Firm*—Lee & Morse, P.C.

(57) ABSTRACT

A silicon optoelectronic device and an optical transceiver, wherein the silicon optoelectronic device includes an n- or p-type silicon-based substrate and a doped region formed in a first surface of the substrate and doped to an opposite type from that of the substrate. The doped region provides photoelectrical conversion. The silicon optoelectronic device includes a light-emitting device section and a light-receiving device section. These sections use the doped region in common and are formed in the first surface of the substrate. The silicon optoelectronic device has an internal amplifying circuit, can selectively perform emission and detection of light, and can control the duration of emission and detection of light.

41 Claims, 8 Drawing Sheets

U.S. PATENT DOCUMENTS

| | | | |
|---|---|---|---|
| 6,758,608 B1* | 7/2004 | Van Arendonk et al. | 385/89 |
| 6,806,111 B1* | 10/2004 | Ehrichs et al. | 438/29 |
| 2002/0131727 A1* | 9/2002 | Reedy et al. | 385/88 |
| 2002/0181915 A1* | 12/2002 | Craig et al. | 385/131 |
| 2003/0020121 A1* | 1/2003 | Rockwell et al. | 257/378 |
| 2003/0127655 A1 | 7/2003 | Choi et al. | 257/79 |
| 2003/0136969 A1* | 7/2003 | Kuniyasu | 257/85 |
| 2003/0218666 A1* | 11/2003 | Holm et al. | 347/130 |

* cited by examiner

SILICON OPTOELECTRONIC DEVICE AND OPTICAL SIGNAL INPUT AND/OR OUTPUT APPARATUS USING THE SAME

BACKGROUND OF THE INVENTION

1. Field of the Invention

The present invention relates to a silicon optoelectronic device and an optical signal input and/or output apparatus using the same. More particularly, the present invention relates to a silicon optoelectronic device capable of both emitting and receiving light and an optical signal input and/or output apparatus, i.e., an optical transceiver, using the same.

2. Description of the Related Art

Silicon semiconductor substrates can be used to highly integrate devices, such as logic devices, operation devices, drive devices, therein, with excellent reliability. Since silicon is inexpensive, these highly integrated circuits can be formed at a much lower cost than using a compound semiconductor. For these reasons, silicon (Si) is currently used as a base material for most integrated circuits.

Due to this prevalent usage and numerous advantages, attempts have been made to create optoelectronic devices in silicon. However, silicon has an indirect transition band gap that makes photoelectric conversion difficult. Thus, optoelectronic devices, such as light-emitting devices, e.g. a light-emitting diode (LED), are usually fabricated using a compound semiconductor material that has a direct transition band gap, allowing easy realization of photoelectric conversion.

A light-emitting device emits light only when a current above a critical current is applied thereto. Typically, supply of current at an appropriate level to the light-emitting device requires an amplifying circuit and/or a switching circuit. The amplifying circuit amplifies a small intensity of current to a current level appropriate to oscillate the light-emitting device and the switching circuit controls on/off operation for the light-emitting device.

Due to the resultant semiconductor heterojunction, it is impractical to integrally fabricate a device made of a compound semiconductor and a device made of silicon. Therefore, the amplifying circuit and/or a switching circuit must be fabricated separately from and installed external to the light-emitting device. However, parasitic effects of reactance and capacitance in the external power lines make realization of high-speed switching difficult.

Further, when using an array of light-emitting devices made of compound semiconductor materials as a display device, the external switching circuits control light emission on a pixel-by-pixel basis. However, this external provision makes it difficult to control the turn-on and turn-off time of current used on a pixel-by-pixel basis, hindering control of the duration of light emission.

There has been an increasing demand for taking photographs and transmitting them to others and for displaying images sent from others. To meet this demand, as shown in FIG. 1, a computer system includes a separate camera 2, in addition to a monitor 1, so that a user may photograph and view objects, and send and receive such images. The computer system In FIG. 1 also includes a main frame 3 and a keyboard 4. Since a conventional display device, such as the monitor 1, can only display an image, the separate camera 2 is required to photograph an object.

In order for the use to be photographed while allowing the user to still view an image on the display device, the camera must be positioned away from the display device. This positioning prevents a photograph of the full face of the user looking at the display device, thus reducing the liveliness of the interactive visual communication.

SUMMARY OF THE INVENTION

The present invention is therefore directed to a silicon optoelectronic device which substantially overcomes one or more of the problems due to the limitations and disadvantages of the related art.

It is a feature of the present invention to provide a silicon optoelectronic device that is formed on a silicon-based substrate, has a internal amplifying circuit, can selectively perform emission and reception of light, and can easily control the duration of emission and reception of light.

It is another feature of the present invention to provide an optical signal input and/or output apparatus capable of transmitting information bi-directionally using an array of the above silicon optoelectronic devices.

At least one of the above and other features of the present invention may be realized by providing a silicon optoelectronic device including: an n- or p-type silicon-based substrate; a doped region formed in a first surface of the substrate and doped to be an opposite type from that of the substrate and in which emission and reception of light occur; a light-emitting device section; and a light-receiving device section, both of which use the doped region in common for photoelectric conversion and are formed in the first surface.

The light-emitting device section may have a gate turn off (GTO) thyristor structure. The light-emitting device section may include a first semiconductor material region separate from the doped region and formed to a deeper depth than the doped region in the first surface and doped to an opposite type to that of the substrate; a second semiconductor material region which is adjacent to the first semiconductor material region and formed in the surface of the substrate doped to an opposite type to that of the first semiconductor material region; and an electrode structure which supplies an electrical signal for controlling the magnitude and duration of light emission. The electrode structure may include a first electrode electrically connected to the doped region; a second electrode electrically connected to the second semiconductor material region; and a first gate electrode electrically connected to the first semiconductor material region.

The light-receiving device section, the substrate and the doped region may form a metal-oxide-semiconductor (MOS) transistor structure. The light-receiving device section may include a third semiconductor material region separate from the doped region and formed to a deeper depth than the doped region in the surface of the substrate to be doped to an opposite type to that of the substrate; an oxide film which is formed on the surface of the substrate and positioned between the third semiconductor material region and the doped region; a third electrode formed on the third semiconductor material region; and a second gate electrode formed on the oxide film.

The doped region may be formed to a depth so that the silicon optoelectronic device realizes the photoelectric conversion by the quantum confinement effect at a p-n junction between the doped region and the substrate.

The silicon optoelectronic device may further include a switching circuit which selectively controls connection of a light emission power to the light-emitting device section and connection of a reverse bias power and/or a load resistance for light reception to the light-receiving device section.

The switching circuit may include a first switch for connecting selectively the light emission power to the light-emitting device section; and a second switch for connecting selectively the reverse bias power and/or load resistance for light reception to the light-receiving device section. The switching circuit may be formed to be operated according to the complementary metal-oxide semiconductor (CMOS) logic in such a way that when the first switch is turned on, the second switch is turned off, and when the second switch is turned on, the first switch is turned off. The first and second switches may be integrally formed on the substrate.

The silicon optoelectronic device may further include a blocking region formed at a predetermined depth from the surface of the substrate around the doped region to block a leakage current.

At least one of the above and other features of the present invention may be realized by providing an optical transceiver including a silicon optoelectronic device panel having an array of silicon optoelectronic devices capable of emitting and receiving an optical signal arranged in an n- or p-type silicon-based substrate; and an electrode structure patterned so that each of the silicon optoelectronic devices can selectively input and output an optical signal. Each of the silicon optoelectronic devices includes a doped region formed in a surface of the substrate doped to an opposite type from that of the substrate and in which emission and reception of light occur; and a light-emitting device section and a light-receiving device section which use the doped region in common and are formed at the same surface of the substrate as in which the doped region is formed.

The silicon optoelectronic device panel may include at least three silicon optoelectronic devices per each pixel and the optical signal input and/or output apparatus may be used as an image input and/or output apparatus.

The silicon optoelectronic device panel may include at least three silicon optoelectronic devices for light emission and reception per each pixel and the silicon optoelectronic devices corresponding to each pixel may emit and receive light of different wavelengths to represent a color image.

The silicon optoelectronic device panel may include at least three silicon optoelectronic devices for light emission and light reception per each pixel and the optical signal input and/or output apparatus may further includes a color filter installed at the front part of the silicon optoelectronic device panel to represent a color image.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
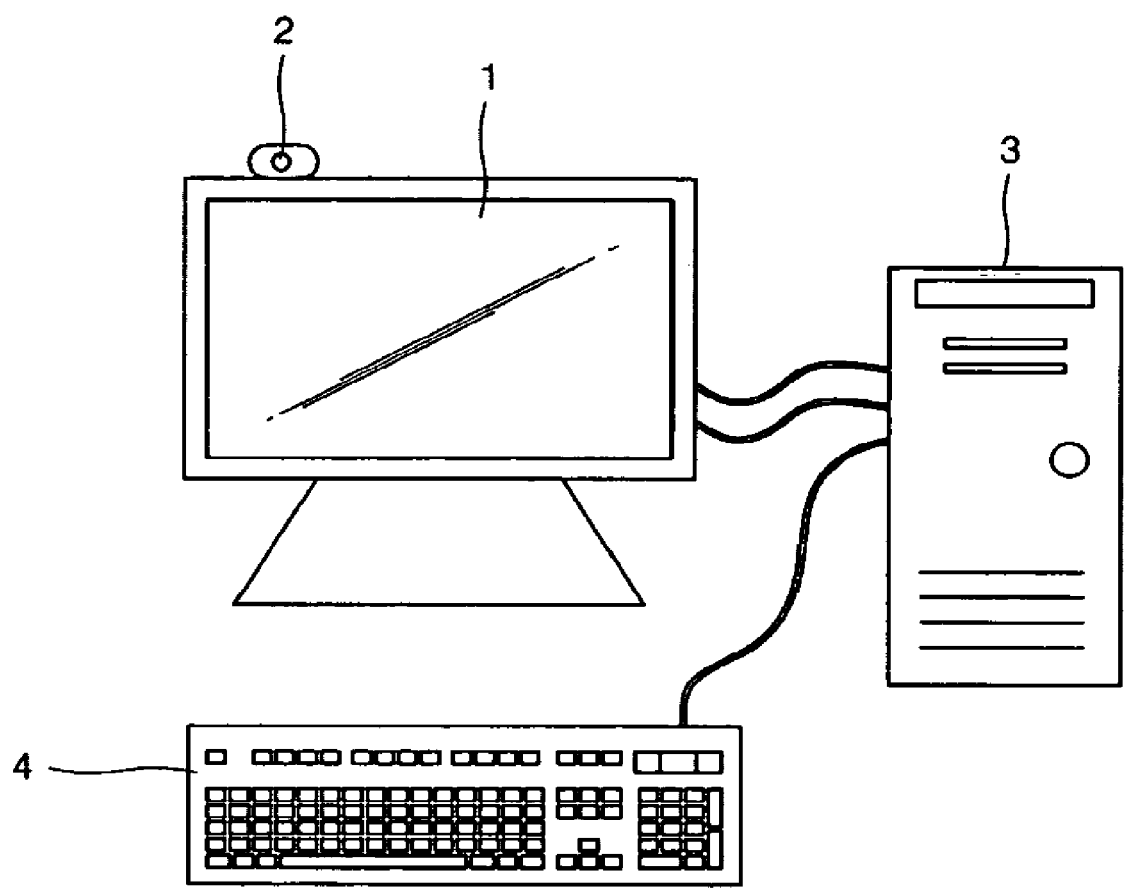
FIG. 1 is a schematic view of a general computer system.

Korean Patent Application No. 2003-11638, filed on Feb. 25, 2003, in the Korean Intellectual Property Office, and entitled: "SILICON OPTOELECTRONIC DEVICE AND OPTICAL SIGNAL INPUT AND/OR OUTPUT APPARATUS USING THE SAME," is incorporated herein by reference in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it may be directly on the other layer or substrate, or intervening layers may also be present. Further, it will be understood that when a layer is referred to as being "under" another layer, it may be directly under, or one or more intervening layers may also be present. In addition, it will also be understood that when a layer is referred to as being "between" two layers, it may be the only layer between the two layers, or one or more intervening layers may also be present. Like numbers refer to like elements throughout.

Figure 2:
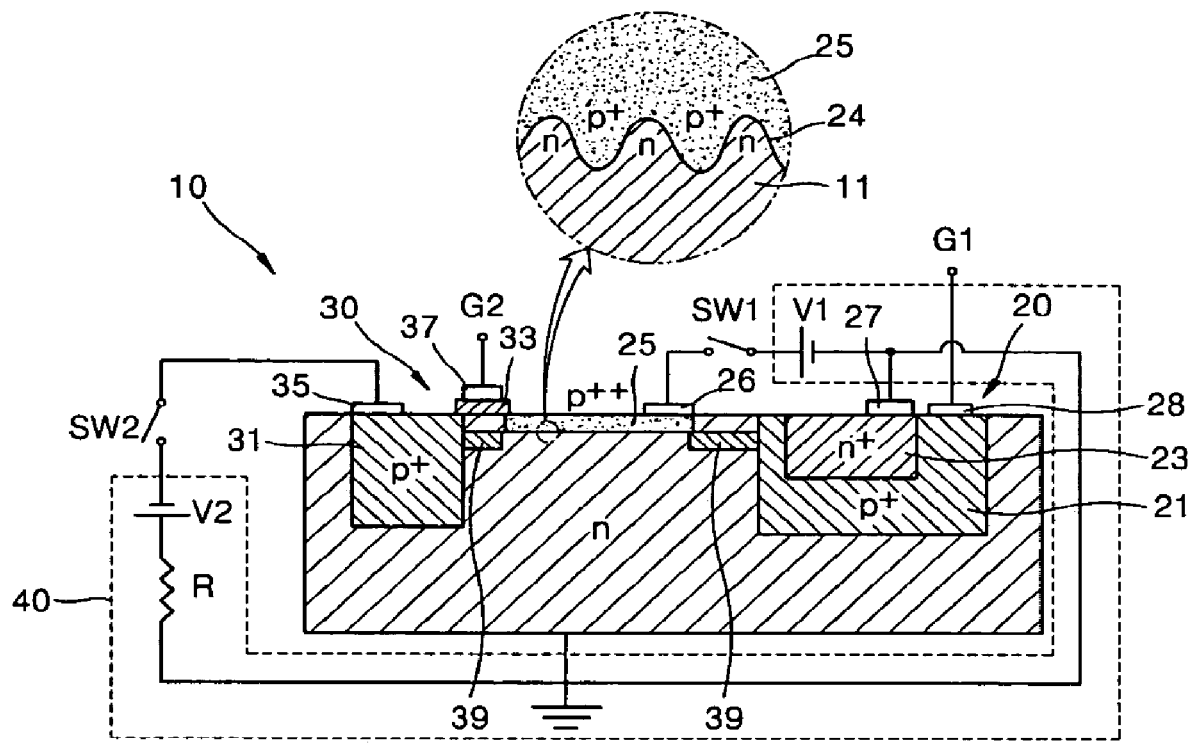
FIG. 2 shows a combined structure of a silicon optoelectronic device according to the present invention and its external driving circuit.

FIG. 2 shows a combined structure of a silicon optoelectronic device 10 according to the present invention and an external circuit 40. Referring to FIG. 2, the silicon optoelectronic device 10 includes an n- or p-type silicon-based substrate 11; a doped region 25 in which emission and reception of light occur; and a light-emitting device section 20 and a light-receiving device section 30 which have the doped region 25 in common and are arranged at the same surface of the substrate 11 as at which the doped region 25 is formed.

The silicon optoelectronic device 10 may further include an electrode structure that inputs an electrical signal for controlling emission and reception of light or inputs a light emission power V1 and/or a reverse bias power V2 for reception of light, and outputs a light-receiving signal. The silicon optoelectronic device 10 may further include a switching circuit that selectively controls connection of the light emission power V1 to the light-emitting device section 20 and connection of the reverse bias power V2 and a load resistance R to the light-receiving device section 30. The details of these structures will be discussed later below. First, characteristics of the materials that may be used in the optoelectronic devices are outlined.

The substrate 11 may be formed of a predetermined semiconductor material containing silicon (Si), such as, Si, silicon carbide (SiC), or diamond. The substrate 11 is doped with n- or p-type dopants. For example, the substrate 11 may be a monocrystalline silicon wafer doped with an n-type dopant.

The doped region 25 may be formed to an ultra-shallow depth in a surface of the substrate 11 using a dopant of an opposite type to that of the substrate 11. The doped region 25 may be formed by injection of a dopant by a non-equilibrium diffusion or implantation process to thereby induce photoelectric conversion.

A silicon optoelectronic device having an ultra-shallow doped region forming a quantum structure in a p-n junction of a silicon-based substrate is set forth in co-pending, commonly assigned U.S. patent application Ser. No. 10/122, 421 now published as US 2003/0127655 entitled "Silicon Optoelectronic Device and Light-emitting Apparatus Using the Same," which is herein incorporated by reference. As discussed therein, a doped region may be doped to an opposite type to that of the substrate by non-equilibrium diffusion of a predetermined dopant into the substrate through openings of a control film.

When the substrate 11 is based on an n-type silicon, the doped region 25 is oppositely doped, e.g., with a p++-type dopant. On the other hand, if the substrate 11 is based on a p-type silicon, the doped region 25 is doped to an opposite type to that of the substrate 11 accordingly.

Preferably, a control film (not shown) is a silicon oxide film, e.g., ($SiO_2$) film, with an appropriate thickness so that the doped region is formed to an ultra-shallow doped depth. For example, the control film can be patterned in such a way that a $SiO_2$ film is formed on the surface portion of the substrate 11 intended for the formation of the doped region 25 and then etched by a photolithography process to form openings for a diffusion process. The openings allow the patterned control film to serve as a mask during formation of the doped region 25 so that the doped region 25 can be formed to an ultra-shallow depth. The control film is not shown in FIG. 2, since the control film is removed after the doped region 25 has been formed.

The doped region 25 may be created by injecting a predetermined dopant, such as boron and phosphorus, into the substrate 11 through the openings of the control film. The doped region 25 is ultra-shallowly doped with an opposite type to that of the substrate 11, for example, a p++-type dopant. By proper selection of the injecting process, e.g., using a non-equilibrium diffusion process or an implantation process, the doped region 25 having an ultra-shallow depth may be realized. The formation of the doped region 25 results in a p-n junction 24 having a quantum structure at an interface between the doped region 25 and the substrate 11. As can be seen in the enlarged view in FIG. 2, near the p-n junction 24, doped layers of different dopant types alternate to form the quantum structure. In this particular example, the quantum structure includes quantum wells and underlying barriers of about 2 and 3 nm in width, respectively.

As described above, the doped process can be controlled so that the doped region 25 has an ultra-shallow depth such that a quantum structure having of at least one of a quantum well, a quantum dot and a quantum wire is formed at an interface between the doped region 25 and substrate 11, i.e., the p-n junction 24. This quantum structure provides a quantum confinement effect, enabling photoelectric conversion. Typically, quantum wells are formed at the p-n junction 24, but quantum dots or quantum wires may also be formed. A composite structure having at least two of the quantum wells, quantum dots, and quantum wires may also be formed at the p-n junction 24.

Control of the doped process includes controlling the thickness of the control film and the conditions of a diffusion process. For example, by using an appropriate diffusion temperature during the diffusion process and accounting for the deformed potential, e.g., due to the micro-defect pattern of the surface of the substrate 11, the thickness of the diffusion profile can be adjusted to a desired thickness, e.g., 10–20 nm. Thus, the quantum structure is the ultra-shallow diffusion profile is formed. The surface deformation of the substrate 11 is dependant on the initial thickness of the control film and surface pre-treatment. The surface deformation increases as the diffusion process proceeds.

As is known in the field of the diffusion technology, if the thickness of the control film is greater than an appropriate thickness, e.g., several thousand Angstroms, or if the diffusion temperature is too low, the diffusion of the dopants is affected by vacancies, resulting in deep diffusion. On the other hand, if the thickness of the control film is less than the appropriate thickness or a diffusion temperature is too high, the diffusion is affected by Si self-interstitials, also resulting in deep diffusion. Therefore, by forming the control film to a thickness in which the Si self-interstitials and the vacancies are generated in a similar ratio, they offset one another, retarding dopant diffusion. As a result, desired ultra-shallow doped may be realized. The physical properties of the vacancies and self-interstitials are well known in the field of the diffusion technology, and thus, the detailed descriptions thereof will be omitted.

As described above, during the formation of the doped region 25 to an ultra-shallow depth, a quantum structure is formed at the p-n junction 24 between the doped region 25 and the substrate 11. As a result, the quantum confinement effect, i.e., the creation and annihilation of electron-hole pairs, occurs. This quantum confinement effect enables photoelectric conversion at high quantum efficiency. Accordingly, the silicon optoelectronic device 10 performs emission and reception of light.

For example, when a current for light emission is applied to the doped region 25, carriers, i.e., electrons and holes, are then inejcted into the quantum structure of the p-n junction 24 and are recombined (annihilated) at a subband energy level of the quantum structure. Electroluminescence (EL) occurs at predetermined wavelengths according to the recombination state of carriers. The quantity of light emitted depends on the magnitude of the current applied.

When light is incident in the doped region 25, photons are absorbed into the p-n junction 24 to create electron-hole pairs. The electrons and holes are excited to a subband energy level of the quantum structure formed at the p-n junction 24. When a load resistance R is connected to an output terminal as shown in FIG. 2, the optoelectronic device 10 generates an output signal $V_{out}$ that is proportional to the amount of light absorbed.

Wavelengths of light emitted and absorbed at the doped region 25 are determined by micro-cavities arising from micro-defects formed on the surface of the substrate 11, specifically, on the surface of the doped region 25. By adjusting the size of the micro-cavities during fabrication, the silicon optoelectronic device 10 having the desired wavelength ranges for light absorption and emission can be realized. When the wavelength ranges are well matched to the resonance wavelengths of the micro-cavities, the intensity of the light output and sensitivity to received light can be increased.

Therefore, by adjusting the sizes of micro-cavities during fabrication, the silicon optoelectronic device 10 of the present invention can emit and detect light of a specific wavelength. By providing a variety of sizes of micro-cavities, the silicon optoelectronic device 10 can emit and absorb white light. In other words, when the micro-cavities have a uniform size, the silicon optoelectronic device 10 outputs and absorbs light of a specific wavelength, e.g., red, green, or blue light. On the other hand, if the micro-cavities have numerous different sizes, the silicon optoelectronic device 10 outputs and absorbs light of various corresponding wavelengths, e.g., white light. By adjusting the size of the micro-cavities, the silicon optoelectronic device 10 can be designed to emit and detect light over a broad spectrum spanning short wavelengths through long wavelengths, for example, ranging from ultraviolet (UV) to infrared (IR).

In accordance with the fabrication process noted above, since the micro-cavities are formed by a deformed potential due to micro-defects on the surface of the doped region 25, by adjusting the deformed potential, the quantum structure is deformed, thus determining the micro-cavities. Thus, light of a desired wavelength or desired wavelength range can be emitted or detected.

The silicon optoelectronic device 10 having the ultra-shallow doped region 25 as described above has high quantum efficiency since the quantum confinement effect occurs due to local variations in potential of charge distribution at the p-n junction 24 and a sub-band energy level is formed in the quantum structure.

Structurally, the silicon optoelectronic device 10 has a planar structure, i.e., the light-emitting device section 20 and the light-receiving device section 30 are arranged at the same surface of the substrate 11 as at which the doped region 25 is formed.

Preferably, the light-emitting device section 20 has a gate turn off (GTO) thyristor structure. The GTO thyristor is a member of the thyristor family and is also referred to as a GTO transistor. The GTO thyristor can be turned off even when an anode current flows. As used herein, thyristor is a general name for a four-layer semiconductor device with p-n-p-n junctions.

According to a specific embodiment of the present invention, the light-emitting device section 20 includes a first semiconductor material region 21 separate from the doped region 25 and a second semiconductor material region 23 adjacent to the first semiconductor material region 21. The first semiconductor material region 21 is formed to a deep depth in a surface of the substrate 11 and is doped with an opposite type dopant of the substrate 11. The second semiconductor material region 23 is doped to an opposite type to that of the first semiconductor material region 21, i.e., that of the substrate 11.

The first and second semiconductor material regions 21 and 23 may be formed by injecting dopants into the surface of the substrate 11 deeper than the doped region 25. For example, the first semiconductor material region 21 may be formed by injection of an appropriate dopant using a general diffusion process that ensures deeper diffusion than the doped region 25. Then, the second semiconductor material region 23 may be formed by injection of an appropriate dopant into a portion of the first semiconductor material region 21 using the same diffusion process as in the formation of the first semiconductor material region 21. Alternatively, the first and second semiconductor material regions 21 and 23 may be formed by injection of appropriate dopants using an implantation process.

The substrate 11 may be etched to form trenches therein and then material of appropriate conductivity may be stacked in the trenches to form the first semiconductor material region 21. Then, a portion of the first semiconductor material region 21 may be etched and then material of appropriate conductivity may be stacked in the etched portion or an appropriate dopant may be injected into a portion of the first semiconductor material region 21 to form the second semiconductor material region 23.

An electrode structure for controlling light emission and/or inputting a light emission power may include a first electrode 26 electrically connected to the doped region 25, a second electrode 27 electrically connected to the second semiconductor material region 23, and a first gate electrode 28 electrically connected to the first semiconductor material region 21.

The first electrode 26, the second electrode 27, and the first gate electrode 28 are formed in such a manner that at least portions of the first electrode 26, the second electrode 27, and the first gate electrode 28 are positioned on the doped region 25, the second semiconductor material region 23, and the first semiconductor material region 21, respectively. The first electrode 26, the second electrode 27, and the first gate electrode 28 may be patterned on a surface of the substrate 11 to enable electrical connection with a switching circuit SW1 and the external circuit 40.

The first electrode 26 may be formed on a portion of the doped region 25 using an opaque electrode material such as metal. Alternatively, the first electrode 26 may also be made of a transparent electrode material such as indium tin oxide (ITO) to cover at least a portion of the doped region 25. The second electrode 27 and the first gate electrode 28 may be made of an opaque electrode material such as metal.

As shown in FIG. 2, the switching circuit SW1 is electrically connected between the first and second electrodes 26 and 27 to selectively supply light emission power. The first gate electrode 28 serves as a first gate G1, and receives a first gate G1 signal for the control of the light emission operation.

Figure 3:
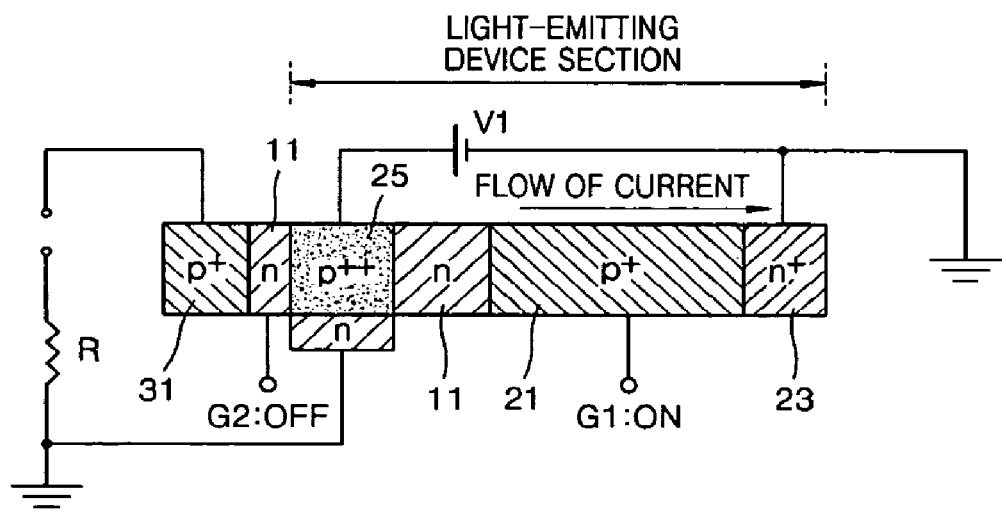
FIG. 3 shows a junction structure of regions required for emission and reception of light, and a working state of the external circuit for light emission operation in the silicon optoelectronic device of the present invention shown in FIG. 2.

As described above, when the doped region 25, the substrate 11, the first semiconductor material region 21, and the second semiconductor material region 23 contributing to light emission operation have p++, n, p+, and n+ conductivity types, respectively, as shown in FIG. 2, the light-emitting device section 20 contributing to light emission operation in the silicon optoelectronic device 10 of the present invention has a four-layer structure of p-n-p-n junctions. In this case, the four-layer structure of the p-n-p-n junctions of the light-emitting device section 20 is planar, as shown in FIG. 3. That is, in the optoelectronic device of the present invention, the silicon optoelectronic device 10 has a structure such that the GTO thyristor is arranged in planar structure. FIG. 3 shows a junction structure of regions contributing to emission and reception of light, and an operating state of the external circuit for light emission operation, in the silicon optoelectronic device 10 shown in FIG. 2.

Figure 4:
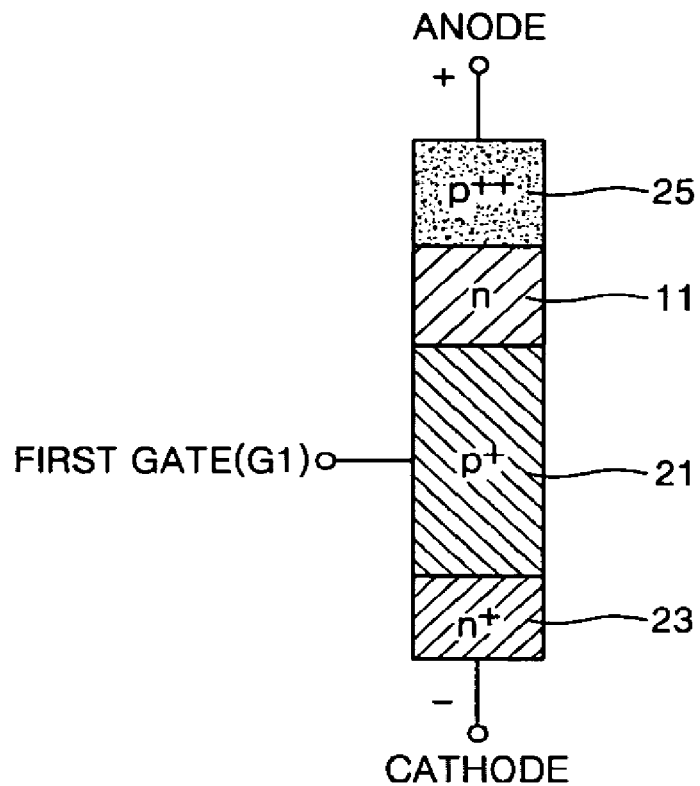
FIG. 4 shows an equivalent structure of a light-emitting device section in the silicon optoelectronic device shown in FIG. 2.

When light emission power V1 is applied to the light-emitting device section 20 of the silicon optoelectronic device 10 with the above-described structure, light is emitted when the first gate G1 is ON, and light is not emitted when the first gate G1 is OFF. In this case, the first electrode 26 electrically connected to the doped region 25 and the second electrode 27 electrically connected to the first semiconductor material region 21 serve as an anode and a cathode, respectively. The equivalent structure of the light-emitting device section 20 is as shown in FIG. 4.

While the doped region 25, the substrate 11, and the second semiconductor material region 23 form a p-n-p transistor structure, the substrate 11, the second semiconductor material region 23, and the first semiconductor material region 21 form an n-p-n transistor structure. Therefore, the light-emitting device section 20 of the silicon optoelectronic device 10 has a built-in two-stage transistor structure.

Figure 5:
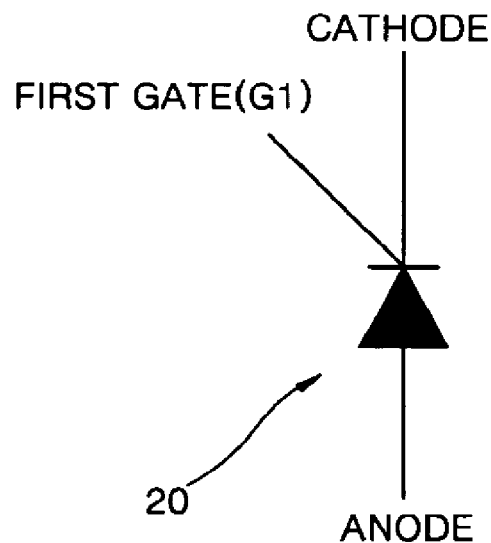
FIG. 5 shows an equivalent symbol for a light-emitting device section having a two-stage transistor in the silicon optoelectronic device shown in FIG. 2.

The light-emitting device section 20 having such built-in two-stage transistor can amplify a micro-current applied through the first gate G1 while cutting off the flow of reverse current. In addition, the light-emitting device section 20 can control the amount of light emitted at the p-n junction 24 and can switch the light emission ON or OFF according to current applied through the first gate G1. Therefore, as shown in FIG. 5, the light-emitting device section 20 has an integral structure of a diode for current amplification with a switch. FIG. 5 shows an equivalent symbol for the light-emitting device section 20 having the two-stage transistor as described above.

When the substrate 11 is based on a p-type material, the doped region 25 and the first and second semiconductor material regions 21 and 23 are doped with the opposite conductivity types to those presented above, accordingly. In this case, the first and second electrodes 26 and 27 serve as cathode and anode, respectively, and the first gate electrode 28 serves as the first gate G1.

The light-receiving device section 30 of the silicon optoelectronic device 10, together with the substrate 11 and the doped region 25, may form a metal-oxide-semiconductor (MOS) transistor structure.

According to a specific embodiment of the present invention, the light-receiving device section 30 includes a third semiconductor material region 31 separate from the doped region 25, an oxide film 33 which is formed on the surface of the substrate 11 and positioned between the third semiconductor material region 31 and the doped region 25, a third electrode 35 formed on the third semiconductor material region 31, and a second gate electrode 37 formed on the oxide film 33. The third semiconductor material region is formed to a deep depth in a surface of the substrate 11 and is to be doped with an opposite type dopant to that of the substrate, e.g., a p+ type.

Like the first and second semiconductor material regions 21 and 23 of the light-emitting device section 20, the third semiconductor material region 31 can be formed by injection of a dopant into a position of the substrate 11 deeper than the doped region 25. For example, the third semiconductor material region 31 can be formed by injection of a dopant to be doped to an opposite type to that of the substrate 11 into a position of the substrate 11 intended for the formation of the third semiconductor material region 31 using a general diffusion process that ensures a deeper diffusion than the doped region 25. Alternatively, the third semiconductor material region 31 may also be formed by injection of a dopant according to an implantation process. The substrate 11 may be etched to form trenches and then a material of appropriate conductivity may be stacked in the trenches to thereby form the third semiconductor material region 31.

The oxide film 33 may span the third semiconductor material region 31 and the doped region 25. The third electrode 35 is formed using an opaque metal electrode material to be electrically connected to the third semiconductor material region 31. The second gate electrode 37 is formed on the oxide film 33 using an opaque metal electrode material. The third electrode 35 and the second gate electrode 37 are formed in such a manner that at least portions of the third electrode 35 and the second gate electrode 37 are positioned on the third semiconductor material region 31 and the oxide film 33, respectively. They are patterned on the surface of the substrate 11 in an appropriate manner considering electrical connection of them with a switching circuit SW2 and the external circuit 40.

As shown in FIG. 2, for light detecting operation, at least one of the reverse bias power source V2 supplying a reverse bias voltage and the load resistance R is selectively, electrically connected between the third electrode 35 and the substrate 11. The second gate electrode 37 serves as a second gate G2, receiving a second gate G2 signal for control of light reception operation.

The light-receiving device section 30 has substantially a metal-oxide-semiconductor field effect transistor (MOSFET) structure. A MOSFET is a field effect transistor in which the gate is insulated from a semiconductor layer forming a current channel by a thin silicon oxide ($SiO_2$) film, i.e., the oxide film 33.

The opening and shutting of the current channel between the third semiconductor material region 31 and the doped region 25 can be controlled according to the presence and absence of a voltage applied to the second gate G2. In the optoelectronic device 10 according to the present invention, when the load resistance R is connected between the third electrode 35 and the grounded substrate 11, light detection is performed in accordance with the presence of a voltage applied to the second gate G2.

Figure 6:
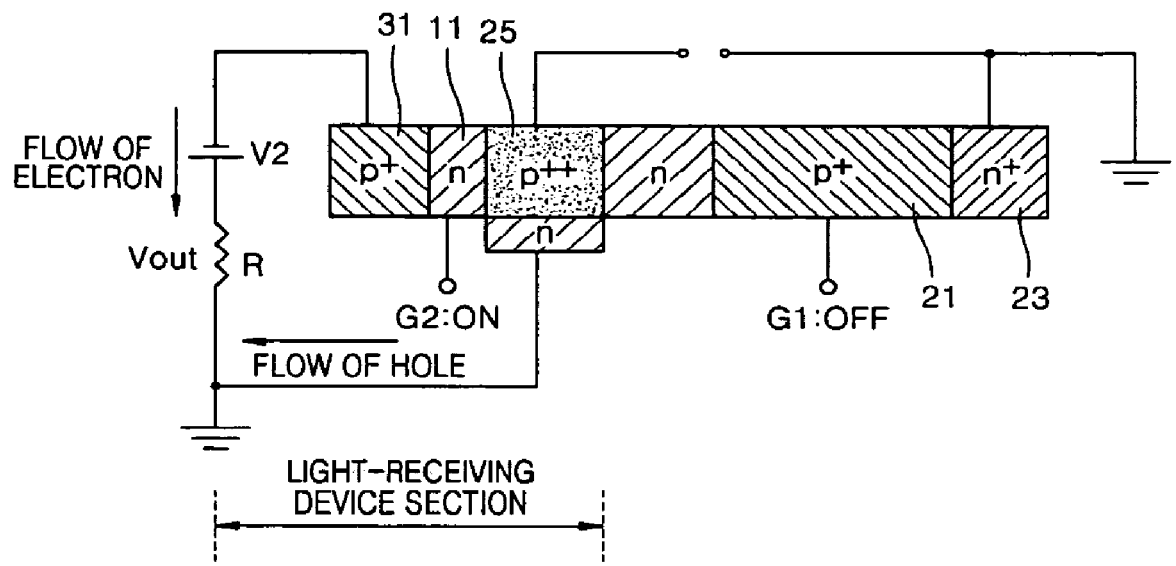
FIG. 6 shows a junction structure of regions required for emission and reception of light, and a working state of the external circuit for light reception operation in the silicon optoelectronic device of the present invention shown in FIG. 2.

FIG. 6 shows a junction structure of regions required for emission and reception of light, and an operating state of the external circuit 40 for light-receiving operation, in the silicon optoelectronic device 10 of the present invention shown in FIG. 2. In the light-receiving device section 30 of the silicon optoelectronic device 10 with the above-described structure, when the load resistance R is electrically connected between the third electrode 35 and the substrate 11 and the second gate G2 is ON, light is detected. The optoelectronic device 10 outputs a signal proportional to the amount of light incident on the doped region 25. When the second gate G2 is OFF, light detection ceases.

The silicon optoelectronic device 10 further includes a switching circuit, which selectively connects the light emission power V1 to the light-emitting device section 20 and at least one of the reverse bias power V2 for light reception and the load resistance R to the light-receiving device section 30. The switching circuit includes a first switch SW1 that selectively connects the light emission power V1 to the light-emitting device section 20 and a second switch SW2 that selectively connects the reverse bias power V2 for light reception and/or load resistance R to the light-receiving device section 30.

Preferably, the switching circuit is formed by complementary metal-oxide semiconductor (CMOS) logic. Thus, when the first switch SW1 is turned on, the second switch SW2 is turned off, and vice versa. CMOS switching logic circuit is known in the art and can be formed on a silicon wafer.

Therefore, the first and second switches SW1 and SW2 can be integrally formed on the substrate 11. Preferably, the first and second switches SW1 and SW2 are integrally formed on the substrate 11, together with the light-emitting device section 20 and the light-receiving device section 30.

In the example shown in FIG. 2, the power source V2 for applying reverse bias to the light-receiving device section 30 and the load resistance R are electrically connected to the light-receiving device section 30 on series. The reverse bias power source V2 is provided for increasing light-receiving sensitivity, but may be omitted.

The additional switching circuit may be omitted from the optoelectronic device 10. In such a configuration, the light emission power source V1 is electrically connected to the light-emitting device section 20, and the load resistance R is electrically connected to the light-receiving device section 30. In this case, the silicon optoelectronic device 10 controls emission and reception of light by the on/off status of the first and second gates G1 and G2.

The silicon optoelectronic device 10 may further include a blocking region 39, which is formed at a predetermined depth from the surface of the substrate 11 around the doped region 25 to block a leakage current. Preferably, the blocking region 39 is formed at a predetermined depth from the surface of the substrate 11 by implantation of $O_2$ around the doped region 25.

The silicon optoelectronic device 10 with the above-described structure is operated as follows. Hereinafter, as an example, the operation of the silicon optoelectronic device 10 having the structure shown in FIG. 2 will be described with reference to FIGS. 3 and 6.

First, as shown in FIG. 3, when the first switch SW1 is closed, and the first and second gates G1 and G2 are turned ON and OFF, respectively, a driving-current is applied from the light emission power source V1 to the light-emitting device section 20. As a result, electrons and holes are recombined at the p-n junction 24 of the doped region 25, thereby emitting of light. In other words, when the light emission power V1 is applied, and the first and second gates G1 and G2 are respectively turned ON and OFF, the light emission power V1 is supplied to the light-emitting device section 20, and thus, light is emitted.

When a current is applied to the first gate electrode 28, an end voltage of the first and second electrodes 26 and 27, i.e., anode and cathode, increases. Both end voltages result in current rapidly flowing through the light-emitting device section 20, as a specific current is applied to the first gate electrode 28.

When a current is applied to the first gate electrode 28 so that the end voltages exceed the break-over voltage, the anode and cathode become conductive, thereby supplying the light-emitting device section 20 with a current required for light emission. Therefore, even if a very small current is applied to the first gate electrode 28, light emission can occur in the light-emitting device section 20 of the silicon optoelectronic device 10 having a two-stage transistor due to recombination of an electron-hole pair caused by the quantum confinement effect at the p-n junction 24.

The amount of light emitted depends on the first gate G1 current applied to the first gate electrode 28 and can be controlled by adjusting the first gate G1 current. The timing of the first gate G1 current controls the duration of the light emission.

When CMOS logic is used for the switching circuit, if the first switch SW1 is closed, the second switch SW2 is opened. Therefore, in this case, at least one of the power V2 for applying reverse bias to the light-receiving device section and load resistance R is not electrically connected to the light-receiving device section 30.

On the other hand, as shown in FIG. 6, when the second switch SW2 is closed to apply a reverse voltage to the light-receiving device section 30, the second gate G2 is in ON, and the first gate G1 is in the OFF. In this state, incident external light is absorbed in the doped region 25 and the substrate 11. As a result, a photo electromotive force is generated. Electrons generated by absorption of light flow into a ground through the doped region 25 and the load resistance R depending on the magnitude of the second gate G2 voltage. On the other hand, holes flow into a ground through the substrate 11. As a result, a closed circuit having a reverse voltage is formed. The amplification of the output signal $V_{out}$ depends on the magnitude of the second gate G2 voltage. Thus, light detection can be controlled according to application of the second gate G2 voltage.

Therefore, in the silicon optoelectronic device 10 of the present invention, emission and reception of light, and the duration and magnitude thereof, can be controlled by selectively opening and closing the first and second switches SW1 and SW2 and by adjusting the voltages of the first and second gates G1 and G2.

Since the light-receiving device section 20 has a two-stage transistor, light emission generated by the quantum confinement effect at the p-n junction, the silicon optoelectronic device 10 according to the present invention a small first gate G1 current can be used.

Since the light-receiving device section 30 has the MOS transistor structure, the silicon optoelectronic device 10 can amplify and then output a light-receiving signal. Application of the second gate G2 voltage and a switching voltage, i.e., the reverse bias voltage, controls the sensitivity of the light detection.

In contrast with a conventional light-emitting device using a compound semiconductor, since the silicon optoelectronic device 10 can amplify a current for light emission and a signal for light reception, a separate, external amplifying circuit is not needed. Therefore, parasitic effects of reactance and capacitance in the external power lines are significantly reduced, thereby allowing for high-speed switching.

The silicon optoelectronic device 10 of the present invention has a switching function for emission and reception of light and can use a monocrystalline silicon wafer as the substrate 11. In this regard, the CMOS logic type switching circuit, which selectively switches the connection of the light emission power V1, and the reverse bias power V2 and/or load resistance R, can be integrally formed on the substrate 11. Therefore, the silicon optoelectronic device 10, and all the switching structures for switching emission and detection of light in the silicon optoelectronic device 10 can be manufactured through a series of semiconductor fabrication processes. Consequently, when the silicon optoelectronic device 10 is formed in an array to be used in an image input and/or output apparatus, for example, there is no need to install an external switching circuit for pixel by pixel control of light emission and/or light detection. Additionally, duration of emission and detection of light can be easily controlled on a pixel-by-pixel basis.

The light-emitting device section 20 and the light-receiving device section 30 have the doped region 25 in common and are formed in a planar structure with respect to the surface of the substrate 11 on which the doped region 25 is formed. The switching devices for the emission and detection of light are horizontally arranged. When a switching operation for emission and reception of light is synchronized with power switching, the silicon optoelectronic device 10 can optimally perform emission and reception of light. Since the silicon optoelectronic device 10 has switching structures that selectively perform emission and reception of light formed on a silicon wafer in a planar structure, it is easy to fabricate the silicon optoelectronic device 10 and to actively design the switching of the CMOS logic circuit.

As described above, because the silicon optoelectronic device 10 has the switching circuit for emission and reception of light and the susbtrate 11 is silicon-based, the additional switching circuit, which selectively controls the electrical connection of the light emission V1 and the reverse bias power V2 for light reception and/or load resistance R, can be integrally formed on the substrate 11. Thus, when the silicon optoelectronic device 10 is integrated in a plane unit cell form to thereby form a silicon optoelectronic device panel. Since the duration of emission and reception of light can be controlled in a cell unit and an amplifying circuit is internal, high-speed switching can be accomplished and the size of the silicon optoelectronic device panel and apparatuses using the same can be reduced. Consequently, a silicon optoelectronic device panel having a one- or two-dimensional array of a plurality of the silicon optoelectronic devices 10 can be used in a thin, small optical signal input and/or output apparatus.

In the formation of an optical signal transceiver capable of emitting and detecting an optical signal in a same cell using a silicon optoelectronic device panel having a one- or two-dimensional array of the silicon optoelectronic devices 10, the electrode structure is patterned such that each of the silicon optoelectronic devices 10 can selectively emit and detect an optical signal.

An illustrative example of an optical transceiver using an array of the silicon optoelectronic devices of the present invention as an image input and/or output apparatus capable of inputting and outputting an image at the same pixel will be described below.

Figure 7:
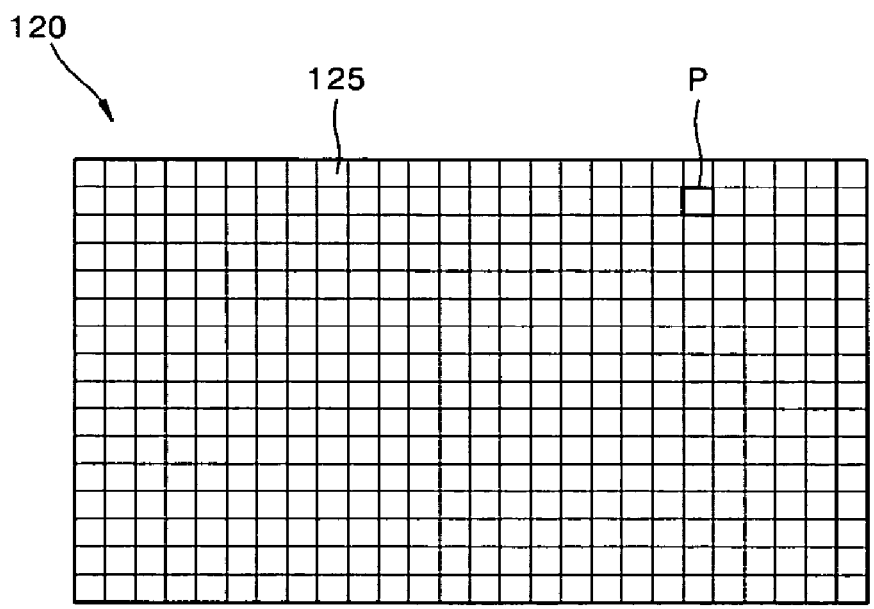
FIG. 7 is a schematic view of an image input and/or output apparatus according to a first embodiment of the present invention.

FIG. 7 is a schematic view of a first embodiment of an image input and/or output apparatus using the silicon optoelectronic device according to the present invention. In FIG. 7, the image input and/or output apparatus includes a silicon optoelectronic device panel 120 having a two-dimensional array of silicon optoelectronic devices 125 on an n- or p-type silicon-based substrate 11. Each of the silicon optoelectronic devices 125 allows for both emission and reception of light and for switching between these operations.

The silicon optoelectronic device 10 as described above may be used for each of the silicon optoelectronic devices 125. Since each of the silicon optoelectronic devices 125 allows for both emission and reception of light as well as easy switching between both operations, input and output of an image can be performed through the same silicon optoelectronic device 125. By providing a silicon optoelectronic device 125 for each pixel P, the silicon optoelectronic device panel 120 allows for image input and output through same pixel.

The silicon optoelectronic devices 125 can control the duration of emission and reception of light, drive light emission with a small amount of current, and amplify and output a light-detecting signal. Therefore, the silicon optoelectronic device panel 120 can control the input and output of an image as desired, while realizing a low power image input/output apparatus.

The silicon optoelectronic devices 125 can be formed in a micro-array using a semiconductor material using a semiconductor fabrication process. Therefore, the silicon optoelectronic device panel 120 may be manufactured on the single n- or p-type silicon-based substrate 11 by a series of semiconductor fabrication processes, discussed above. An electrode structure in the silicon optoelectronic device panel 120 having a two-dimensional array of the silicon optoelectronic devices 125 may be patterned on the substrate 11 so that the selective input and output of an image can be performed on a pixel-by-pixel basis.

In this case, each of the silicon optoelectronic devices 125 may be designed to output and/or detect light of a single wavelength or white light. When each of the silicon optoelectronic devices 125 is designed to output and detect light of a single wavelength or white light, the image input and/or output apparatus according to the present invention can display a monochromic image and generate an electrical monochromic image signal of a photographed object.

Figure 8:
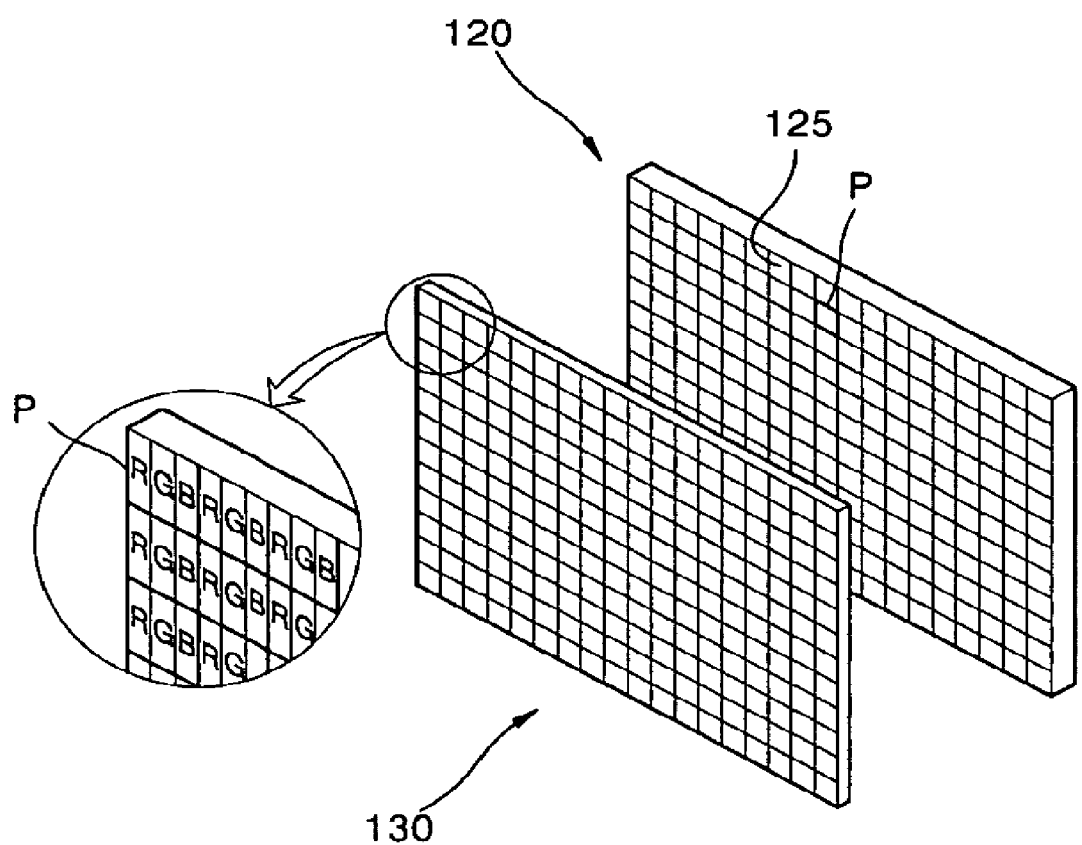
FIG. 8 is a schematic view of an image input and/or output apparatus according to a second embodiment of the present invention.

An image input and/or output apparatus shown in FIG. 8 according to a second embodiment of the present invention includes a silicon optoelectronic device panel 120 having a plurality of silicon optoelectronic devices 125, each of which is designed to output and detect white light. The image input and/or output apparatus further includes a color filter 130 installed at the front part, i.e., at the side for input and output of light, of the silicon optoelectronic device panel 120 to display a full-color image. Therefore, the image input and/or output apparatus can display a full-color image and generate an electrical full-color image signal for a full color of a photographed object.

Figure 9:
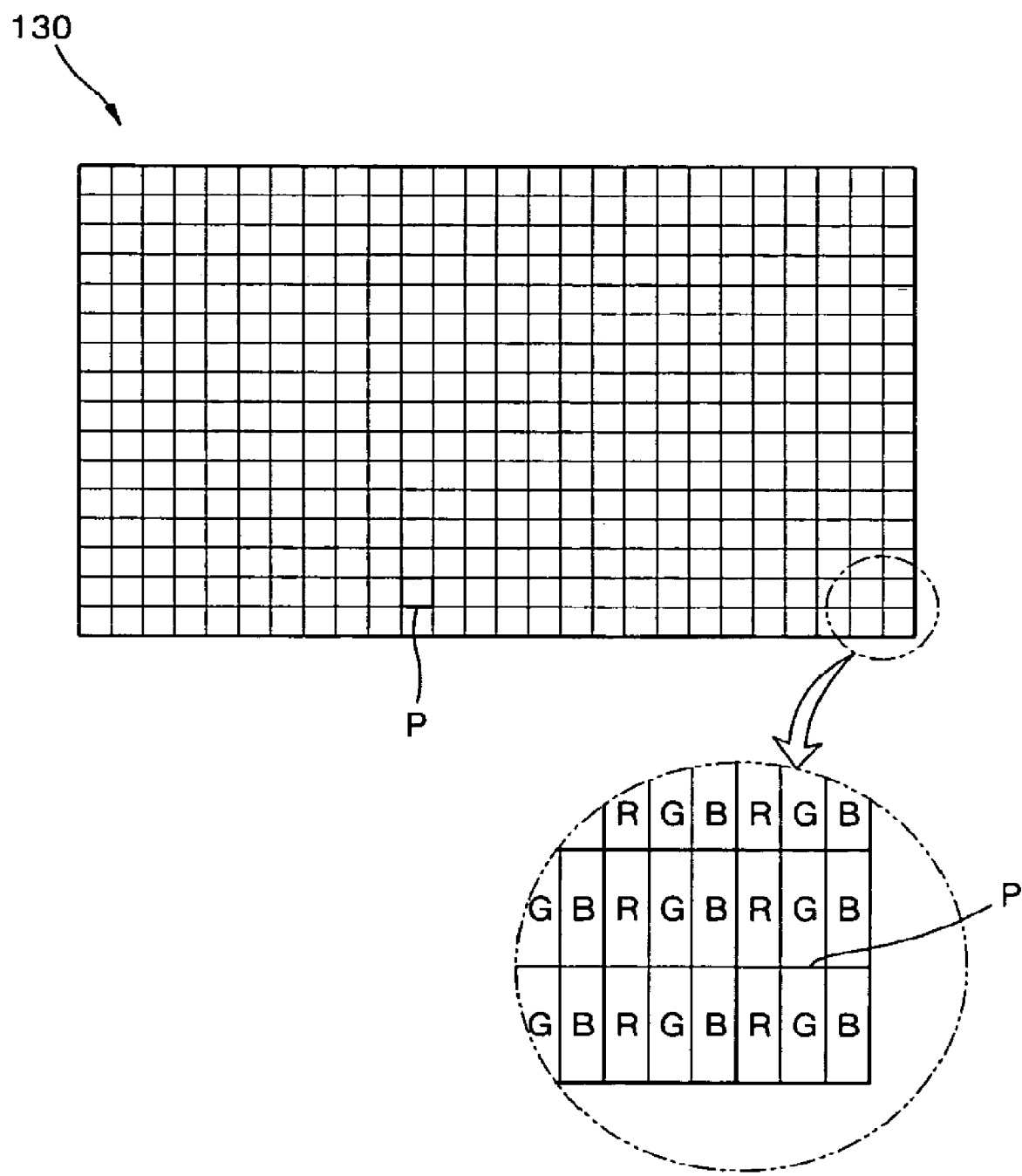
FIG. 9 is a schematic plan view of the structure of a color filter in the image input and/or output apparatus shown in FIG. 8.

In this case, the color filter 130 is designed in such a manner that all R, G, and B color components correspond to each pixel P, as shown in FIG. 9. The arrangement of the R, G, and B color components of the color filter 130 is similar to a two-dimensional array of silicon optoelectronic devices in a silicon optoelectronic device panel according to another embodiment of the present invention, as will be described later. Various changes may be made to the arrangement of the R, G, and B color components in the color filter 130.

In this way, the image input and/or output apparatus including the color filter 130 at the front part of the silicon optoelectronic device panel 120 can input and output a color image. This apparatus makes it possible to convert a photographed image into an electrical color image signal and display a full color image according to an electrical color image signal.

Figure 10:
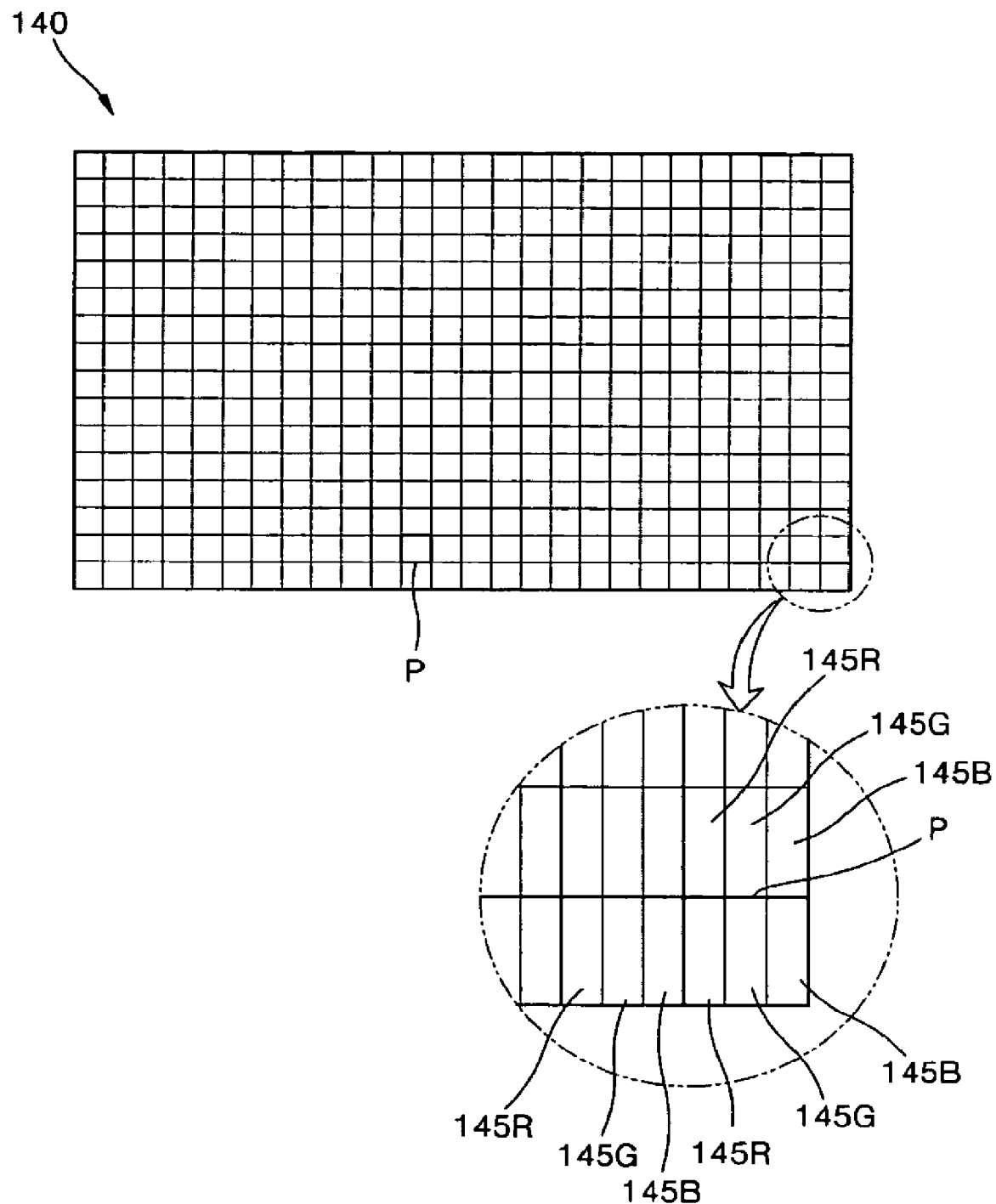
FIG. 10 is a schematic view of an image input and/or output apparatus according to a third embodiment of the present invention.

FIG. 10 is a schematic view of an image input and/or output image apparatus according to a third embodiment of the present invention. A silicon optoelectronic device panel 140 shown therein is designed having at least three silicon optoelectronic devices correspond to each pixel P. FIG. 10 shows an example of the silicon optoelectronic device panel 140 having three silicon optoelectronic devices 145R, 145G, and 145B per pixel P. The silicon optoelectronic device 10 can be used as the three silicon optoelectronic devices 145R, 145G, and 145B to emit and detect red light R, green light G, and blue light B (for example), respectively. In this case, the silicon optoelectronic devices 145R, 145G, and 145B have different micro-cavity lengths, so they can emit and detect light of different wavelengths. Thus, full RGB color can be represented without a separate color filter.

The color filter 130 as shown in FIGS. 8 and 9 may be positioned at the front part of the silicon optoelectronic device panel 140 of FIG. 10 in order to represent more distinct color image. Various changes may be made with respect to color arrangement of the three silicon optoelectronic devices of three or more corresponding to each pixel and/or arrangement of the R, G, B components in the color filter.

As described above, since the image input and/or output apparatuses according to the present invention can selectively input and output a monochromic or color image on a pixel-by-pixel basis, they can be used in equipment requiring bidirectional visual communications such as computer monitors, televisions, and handheld terminals.

Since the image input and/or output apparatuses according to the present invention allow for input and output of an image in a single panel, use of a separate camera for visual communication is eliminated. Handheld terminals may be various types of portable communication equipment such as mobile phones and personal digital assistants (PDAs).

Furthermore, the image input and/or output apparatuses according to the present invention can input and output an image in a single panel, and thus, a full face of an operator can be photographed and transmitted. Therefore, liveliness in visual communications is enhanced.

The present invention has been described above as an image input and/or output apparatus a single silicon optoelectronic device panel having a two-dimensional array of silicon optoelectronic devices, but is not limited thereto. That is, an image input and/or output apparatus according to the present invention may include a combination of a plurality of silicon optoelectronic device panels to provide a larger screen.

Figure 11:
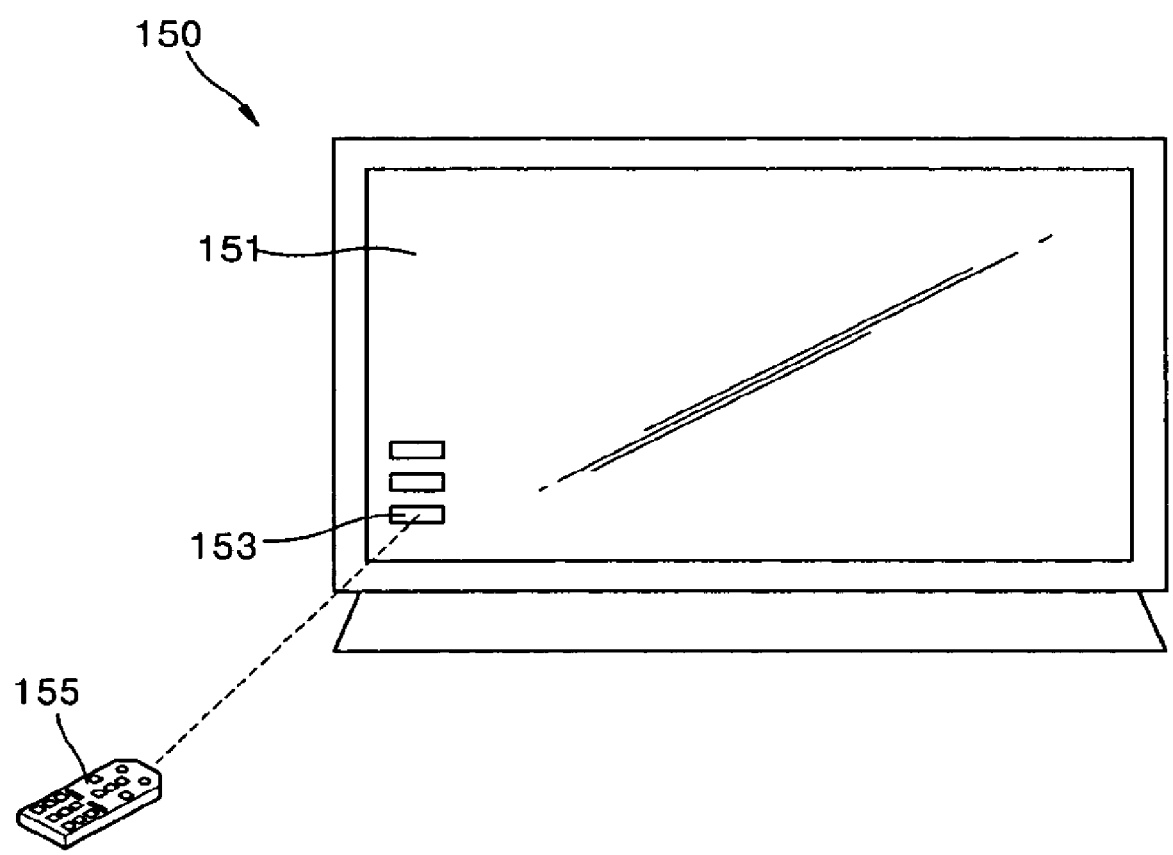
FIG. 11 is a schematic view of a digital television using an image input and/or output apparatus according to the present invention.

FIG. 11 shows a digital television 150 using an image input and/or output apparatus according to the present invention for allowing input of information and selection of a menu on a screen 151 using an optical wireless remote controller 155. The optical wireless remote controller 155 may only illuminate a specific region. When an optical signal illuminates a specific region on the screen 151, for example, a predetermined menu 153, from the optical wireless remote controller 155, a silicon optoelectronic device positioned in the specific region serves as a light-receiving device to detect the optical signal. The received optical signal may be used to change channels of the digital television 150 or navigate the Internet.

In manufacturing a silicon optoelectronic device panel to be used in the aforementioned image input and/or output apparatus, interlayer wiring and power supply lines are connected to each pixel structure as for forming bit lines and word lines in a typical memory fabrication method. Such a silicon optoelectronic device panel is an integrated circuit for emission and reception of light that can be controlled on a pixel-by-pixel basis.

An optical signal input and/or output apparatus according to present invention has been described above in relation to an image input and/or output apparatus. In addition, an optical signal input and/or output apparatus of the present invention can be applied in various application fields requiring bidirectional information transmission, for example, the optical interconnection field.

As is apparent from the above description, a silicon optoelectronic device of the present invention has an internal amplifying circuit, selectively performs emission and detection of light, and can easily control the duration of emission and reception of light. A silicon optoelectronic device of the present invention is formed on a silicon-based substrate. When the silicon optoelectronic device further includes an additional switching circuit that selectively electrically connects light emission power and reverse bias power and/or a load resistance for light reception, the silicon optoelectronic device and the additional switching circuit can be formed on the substrate according to a series of semiconductor fabrication processes.

An array of silicon optoelectronic devices can be used in an optical signal input and/or output apparatus for bi-directional information transmission. When the optical signal input and/or output apparatus is used as an image input and/or output apparatus, it can receive and emit light on a pixel-by-pixel basis. Therefore, the optical signal input and/or output apparatus can be used to display an image and to photograph a full face of a user while allowing the user to view a displayed image in a single panel.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A silicon optoelectronic device, comprising:
    an n- or p-type silicon-based substrate;
    a doped region on a first surface of the substrate and doped to be an opposite type from that of the substrate, thereby forming a p-n junction between the doped region and the substrate, the doped region providing photoelectrical conversion;
    a light-emitting device section formed on the first surface of the substrate; and
    a light-receiving device section formed on the first surface of the substrate, wherein the light-emitting device section and the light-receiving device section use the doped region in common for photoelectrical conversion.

2. The silicon optoelectronic device as claimed in claim 1, wherein the light-emitting device section has a gate turn off (GTO) thyristor structure.

3. The silicon optoelectronic device as claimed in claim 2, wherein the light-emitting device section includes:
    a first semiconductor material region, separate from the doped region and formed to a deeper depth than the doped region in the first surface of the substrate, the first semiconductor material region doped to be an opposite type from that of the substrate;
    a second semiconductor material region, adjacent to the first semiconductor material region and formed in the surface of the substrate, the second semiconductor material region doped to be an opposite type from that of the first semiconductor material region; and
    an electrode structure which supplies an electrical signal for controlling light emission,
    the electrode structure including:
        a first electrode electrically connected to the doped region;
        a second electrode electrically connected to the second semiconductor material region; and
        a first gate electrode electrically connected to the first semiconductor material region.

4. The silicon optoelectronic device as claimed in claim 2, wherein the light-receiving device section includes:
    a first semiconductor material region, separate from the doped region and formed to a deeper depth than the doped region in the surface of the substrate, a first semiconductor material region doped to be an opposite type from that of the substrate;
    an oxide film, formed on the surface of the substrate and positioned between the first semiconductor material region and the doped region;
    a first electrode formed on the first semiconductor material region; and
    a first gate electrode formed on the oxide film.

5. The silicon optoelectronic device as claimed in claim 2, wherein the light-receiving device section, the substrate and the doped region form a metal-oxide-semiconductor (MOS) transistor structure.

6. The silicon optoelectronic device as claimed in claim 2, further including a switching circuit, which selectively controls connection of a light emission power to the light-emitting device section and connection of at least one of a reverse bias power and a load resistance for light reception to the light-receiving device section.

7. The silicon optoelectronic device as claimed in claim 1, wherein the light-emitting device section includes:
a first semiconductor material region, separate from the doped region and formed to a deeper depth than the doped region in the first surface of the substrate, the first semiconductor material region doped to be an opposite type from that of the substrate;
a second semiconductor material region, adjacent to the first semiconductor material region and formed in the surface of the substrate, the second semiconductor material region doped to be an opposite type from that of the first semiconductor material region; and
an electrode structure which supplies an electrical signal for controlling light emission,
the electrode structure including:
a first electrode electrically connected to the doped region;
a second electrode electrically connected to the second semiconductor material region; and
a first gate electrode electrically connected to the first semiconductor material region.

8. The silicon optoelectronic device as claimed in claim 7, wherein the light-receiving device section, the substrate and the doped region form an MOS transistor structure.

9. The silicon optoelectronic device as claimed in claim 1, wherein the light-receiving device section, the substrate and the doped region form an MOS transistor structure.

10. The silicon optoelectronic device as claimed in claim 9, wherein the light-receiving device section includes:
a third semiconductor material region, separate from the doped region and formed to a deeper depth than the doped region in the surface of the substrate, a first semiconductor material region doped to be an opposite type from that of the substrate;
an oxide film, formed on the first surface of the substrate and positioned between the third semiconductor material region and the doped region;
a third electrode formed on the third semiconductor material region; and
a second gate electrode formed on the oxide film.

11. The silicon optoelectronic device as claimed in claim 9, further including a blocking region formed at a predetermined depth from the surface of the substrate around the doped region to block a leakage current.

12. The silicon optoelectronic device as claimed in claim 9, further including a switching circuit which selectively controls connection of a light emission power to the light-emitting device section and connection of at least one of a reverse bias power and a load resistance for light reception to the light-receiving device section.

13. The silicon optoelectronic device as claimed in claim 1, wherein the light-receiving device section includes:
a first semiconductor material region, separate from the doped region and formed to a deeper depth than the doped region in the surface of the substrate, a first semiconductor material region doped to be an opposite type from that of the substrate;
an oxide film formed on the surface of the substrate and positioned between the first semiconductor material region and the doped region;
a first electrode formed on the first semiconductor material region; and
a first gate electrode formed on the oxide film.

14. The silicon optoelectronic device as claimed in claim 1, wherein the doped region has a depth allowing realization of photoelectric conversion due to quantum confinement effect at a p-n junction between the doped region and the substrate.

15. The silicon optoelectronic device as claimed in claim 1, further including a switching circuit, which selectively controls connection of a light emission power to the light-emitting device section and connection of at least one of a reverse bias power and a load resistance for light reception to the light-receiving device section.

16. The silicon optoelectronic device as claimed in claim 15, wherein the switching circuit includes a first switch for selectively connecting the light emission power to the light-emitting device section; and a second switch for selectively connecting at least one of the reverse bias power and load resistance for light reception to the light-receiving device section, wherein the switching circuit is formed to operate as complementary logic such that when the first switch is turned on, the second switch is turned off, and when the second switch is turned on, the first switch is turned off.

17. The silicon optoelectronic device as claimed in claim 16, wherein the first and second switches are integrally formed on the substrate.

18. The silicon optoelectronic device as claimed in claim 17, wherein the substrate is a monocrystalline silicon wafer.

19. The silicon optoelectronic device as claimed in claim 15, further including a blocking region formed at a predetermined depth from the first surface of the substrate around the doped region to block a leakage current.

20. The silicon optoelectronic device as claimed in claim 1, further including a blocking region formed at a predetermined depth from the first surface of the substrate around the doped region to block a leakage current.

21. The silicon optoelectronic device as claimed in claim 20, wherein the blocking region is formed by an $O_2$ implantation process.

22. The silicon optoelectronic device as claimed in claim 1, wherein the substrate is a monocrystalline silicon wafer.

23. An optical transceiver, comprising:
a silicon optoelectronic device panel having an array of silicon optoelectronic devices capable of detecting and emitting an optical signal arranged in an n- or p-type silicon-based substrate; and
an electrode structure selectively controlling detection and emission of each of the silicon optoelectronic devices,
wherein each of the silicon optoelectronic devices includes:
a doped region on a first surface of the substrate and doped to be an opposite type from that of the substrate, thereby forming a p-n junction between the doped region and the substrate to provide photoelectrical conversion;
a light-emitting device section formed on the first surface of the substrate; and
a light-receiving device section formed on the first surface of the substrate, wherein the light-emitting device section and the light-receiving device section use the doped region in common for photoelectrical conversion.

24. The optical transceiver as claimed in claim 23, wherein the light-emitting device section has a GTO thyristor structure.

25. The optical transceiver as claimed in claim 24, wherein the light-emitting device section includes:
a first semiconductor material region, separate from the doped region and formed to a deeper depth than the doped region in the first surface of the substrate, the first semiconductor material region doped to be an opposite type from that of the substrate;
a second semiconductor material region, adjacent to the first semiconductor material region and formed in the surface of the substrate, the second semiconductor material region doped to be an opposite type from that of the first semiconductor material region; and
an electrode structure which supplies an electrical signal for controlling light emission,
the electrode structure including:
a first electrode electrically connected to the doped region;
a second electrode electrically connected to the second semiconductor material region; and
a first gate electrode electrically connected to the first semiconductor material region.

26. The optical transceiver as claimed in claim 23, wherein the light-emitting device section includes:
a first semiconductor material region, separate from the doped region and formed to a deeper depth than the doped region in the first surface of the substrate, the first semiconductor material region doped to be an opposite type from that of the substrate;
a second semiconductor material region, adjacent to the first semiconductor material region and formed in the surface of the substrate, the second semiconductor material region doped to be an opposite type from that of the first semiconductor material region; and an electrode structure which supplies an electrical signal for controlling light emission, the electrode structure including:
a first electrode electrically connected to the doped region;
a second electrode electrically connected to the second semiconductor material region; and
a first gate electrode electrically connected to the first semiconductor material region.

27. The optical transceiver as claimed in claim 23, wherein the light-receiving device section, the substrate and the doped region form an MOS transistor structure.

28. The optical transceiver as claimed in claim 27, wherein the light-receiving device section includes:
a first semiconductor material region, separate from the doped region and formed to a deeper depth than the doped region in the surface of the substrate, a first semiconductor material region doped to be an opposite type from that of the substrate;
an oxide film, formed on the surface of the substrate and positioned between the first semiconductor material region and the doped region;
a first electrode formed on the first semiconductor material region; and
a first gate electrode formed on the oxide film.

29. The optical transceiver as claimed in claim 23, wherein the light-receiving device section includes:
a first semiconductor material region, separate from the doped region and formed to a deeper depth than the doped region in the surface of the substrate, a first semiconductor material region doped to be an opposite type from that of the substrate;
an oxide film, formed on the surface of the substrate and positioned between the first semiconductor material region and the doped region;
a first electrode formed on the first semiconductor material region; and
a first gate electrode formed on the oxide film.

30. The transceiver as claimed in claim 23, wherein the doped region is formed to a depth so that the silicon optoelectronic devices express the photoelectric conversion effect by the quantum confinement effect at a p-n junction between the doped region and the substrate.

31. The optical transceiver as claimed in claim 23, wherein each of the silicon optoelectronic devices further includes a switching circuit, which selectively controls connection of a light emission power to the light-emitting device section and connection of at least one of a reverse bias power and a load resistance for light reception to the light-receiving device section.

32. The optical transceiver as claimed in claim 31, wherein the switching circuit includes a first switch for selectively connecting the light emission power to the light-emitting device section; and a second switch for selectively connecting at least one of the reverse bias power and load resistance for light reception to the light-receiving device section, wherein the switching circuit is formed to operate as complementary logic such that when the first switch is turned on, the second switch is turned off, and when the second switch is turned on, the first switch is turned off.

33. The optical transceiver as claimed in claim 32, wherein the first and second switches are integrally formed on the substrate.

34. The optical transceiver as claimed in claim 31, wherein each of the silicon optoelectronic devices further includes a blocking region formed at a predetermined depth from the surface of the substrate around the doped region to block a leakage current.

35. The optical transceiver as claimed in claim 31, wherein the silicon optoelectronic device panel includes at least three silicon optoelectronic devices per each pixel and the optical transceiver processes images.

36. The optical transceiver as claimed in claim 23, wherein each of the silicon optoelectronic devices further includes a blocking region formed at a predetermined depth from the surface of the substrate around the doped region to block a leakage current.

37. The optical transceiver as claimed in claim 23, wherein the substrate is a monocrystalline silicon wafer.

38. The optical transceiver as claimed in claim 23, wherein the silicon optoelectronic device panel includes a two-dimensional array of the silicon optoelectronic devices.

39. The optical transceiver as claimed in claim 38, wherein the silicon optoelectronic device panel includes at least three silicon optoelectronic devices per each pixel and the silicon optoelectronic devices corresponding to each pixel emit and receive light of different wavelengths to represent a color image.

40. The optical transceiver as claimed in claim 38, wherein the silicon optoelectronic device panel includes at least three silicon optoelectronic devices per each pixel and the optical transceiver further includes a color filter in front of the silicon optoelectronic device panel.

41. The optical transceiver as claimed in claim 38, wherein the optical transceiver is used to input information to a screen controlled by an optical wireless remote controller.

* * * * *